(12) United States Patent
Nagel

(10) Patent No.: US 11,828,669 B2
(45) Date of Patent: Nov. 28, 2023

(54) MEMS SENSOR AND METHOD FOR MANUFACTURING A MEMS SENSOR INCLUDING IMPROVED TIME RELIABLE REINFORCEMENT STRUCTURE

(71) Applicant: Robert Bosch GmbH, Stuttgart (DE)

(72) Inventor: Cristian Nagel, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 276 days.

(21) Appl. No.: 17/284,633

(22) PCT Filed: Jan. 24, 2020

(86) PCT No.: PCT/EP2020/051792
§ 371 (c)(1),
(2) Date: Apr. 12, 2021

(87) PCT Pub. No.: WO2020/156956
PCT Pub. Date: Aug. 6, 2020

(65) Prior Publication Data
US 2021/0396616 A1 Dec. 23, 2021

(30) Foreign Application Priority Data

Jan. 31, 2019 (DE) .......................... 102019201226.4

(51) Int. Cl.
*G01L 9/00* (2006.01)
*B81B 3/00* (2006.01)
*B81C 1/00* (2006.01)

(52) U.S. Cl.
CPC ............ *G01L 9/0072* (2013.01); *B81B 3/007* (2013.01); *B81C 1/00658* (2013.01);
(Continued)

(58) Field of Classification Search
None
See application file for complete search history.

(56) References Cited

U.S. PATENT DOCUMENTS

| 2009/0152654 A1* | 6/2009 | Classen ............... G01P 15/0802 |
| | | 438/48 |
| 2016/0187370 A1* | 6/2016 | Ikehashi ............. G01L 19/0618 |
| | | 73/514.32 |
| 2016/0280534 A1* | 9/2016 | Stahl ..................... B81B 3/0086 |

FOREIGN PATENT DOCUMENTS

DE 102013213065 A1 1/2015

OTHER PUBLICATIONS

International Search Report for PCT/EP2020/051792, dated May 13, 2020.

* cited by examiner

*Primary Examiner* — Brandi N Hopkins
*Assistant Examiner* — Nigel H Plumb
(74) *Attorney, Agent, or Firm* — NORTON ROSE FULBRIGHT US LLP; Gerard Messina

(57) ABSTRACT

A MEMS sensor, including a substrate, and at least three functional layers, which are connected to the substrate on top of one another and spaced apart from one another. A first of the at least three functional layers is deflectably situated. A first electrode, which includes at least two areas being situated at the first functional layer. A first area of the first electrode together with a second electrode of a second of the at least three functional layers form a first capacitance, and a second area of the first electrode together with at least one area of a third electrode of a third functional layer form a second capacitance. The electrodes are situated in such a way that, upon a change in the distance of the electrodes of the first capacitance, a contrary change in the distance of the electrodes of the second capacitance takes place. In this way a micromechanical sensor including capacitive evaluation as a differential capacitor is made possible, so that an output signal of the MEMS sensor may be provided across the
(Continued)

entire measurement range in a manner that is linearly dependent on the deflection.

12 Claims, 5 Drawing Sheets

(52) U.S. Cl.
CPC .... *G01L 9/0048* (2013.01); *B81B 2201/0264* (2013.01); *B81B 2203/0127* (2013.01); *B81B 2203/04* (2013.01)

MEMS SENSOR AND METHOD FOR MANUFACTURING A MEMS SENSOR INCLUDING IMPROVED TIME RELIABLE REINFORCEMENT STRUCTURE

FIELD

The present invention relates to a MEMS sensor, including a substrate and at least three functional layers which are connected to the substrate on top of one another and spaced apart from one another, at least one of the three functional layers being deflectably situated.

The present invention furthermore relates to a method for manufacturing a MEMS sensor.

Although the present invention may, in general, be applied to arbitrary MEMS sensors including at least three functional layers, the present invention is described with reference to capacitive pressure sensors.

BACKGROUND INFORMATION

A micromechanical component is described in German Patent Application No. DE 10 2013 213 065 A1. The micromechanical component includes a substrate and a diaphragm which at least partially spans a cavity, the cavity at a side directed away from the diaphragm being delimited by an upper side of the substrate or by an outer side of a structure, and a plurality of trenches being formed in the substrate or in the structure in such a way that the upper side of the substrate exposed by the cavity, or at least the outer side of the structure exposed by the cavity, is divided by the plurality of trenches, and/or a plurality of recesses on an inner side of the diaphragm is exposed by the cavity.

SUMMARY

In one specific embodiment, the present invention provides a MEMS sensor. In accordance with an example embodiment of the present invention, the MEMS sensor includes a substrate, at least three functional layers, which are connected to the substrate on top of one another and spaced apart from one another, and a first of the at least three functional layers being deflectably situated, a first electrode which includes at least two areas being situated at the first functional layer, a first area of the first electrode together with a second electrode of a second of the at least three functional layers forming a first capacitance, and a second area of the first electrode together with at least one area of a third electrode of a third functional layer forming a second capacitance, and the electrodes being situated in such a way that upon a change in the distance of the electrodes of the first capacitance a contrary change in the distance of the electrodes of the second capacitance takes place.

In one further specific embodiment, the present invention provides a method for manufacturing a MEMS sensor. In accordance with an example embodiment of the present invention, the method includes the steps:

providing a substrate;

providing at least three functional layers, which are connected to the substrate on top of one another and spaced apart from one another;

situating a first electrode, which includes at least two areas, at the first functional layer, a first area of the first electrode together with a second electrode of a second of the at least three functional layers forming a first capacitance, and a second area of the first electrode together with at least one area of a third electrode of a third functional layer forming a second capacitance; and the electrodes being situated in such a way that upon a change in the distance of the electrodes of the first capacitance a contrary change in the distance of the electrodes of the second capacitance takes place.

One of the advantages achieved thereby is that in this way a micromechanical sensor including capacitive evaluation as a differential capacitor is made possible, so that an output signal of the MEMS sensor may be provided across the entire measurement range in a manner that is linearly dependent on the deflection. Another advantage is that the sensitivity compared to known MEMS sensors may be doubled with the same area of the MEMS sensor or, conversely, the area of the MEMS sensor may be cut in half with the same sensitivity. Another advantage is the improved resolution and the improved signal-to-noise ratio. Another advantage is lower costs, in particular, due to reference electrodes not being necessary. Another advantage is the reduction of the influence of process fluctuations since, in particular, all electrodes and electrode distances may be implemented by identical layers.

Further features, advantages and further specific embodiments of the present invention are described hereafter or become apparent thereby.

According to one advantageous refinement of the present invention, second and third electrodes are statically situated. This allows a simple manufacture and a reliable formation of the respective capacitances.

According to another advantageous refinement of the present invention, the second electrode is situated beneath, and at least one area of the third electrode is situated above, the respective area of the first electrode. The advantage of this is that a compact design is made possible, while forming two capacitances at the same time, so that upon a change in the distance of the electrodes of the first capacitance a contrary change in the distance of the electrodes of the second capacitance may take place.

According to another advantageous refinement of the present invention, the first electrode is symmetrically designed in the cross section in parallel to the deflection direction of the first functional layer. The advantage of this is that a simple manufacture is made possible and, at the same time, a reliable formation of the respective capacitances is provided.

According to another advantageous refinement of the present invention, the third electrode includes at least two sub-electrodes situated symmetrically to the first area of the first electrode, the second area of the first electrode including two sub-areas, a respective sub-area being designed to cooperate with a sub-electrode for forming the second capacitance. In this way, two capacitances may be provided in a particularly compact manner, with respective contrary change in the distance of the respective electrodes.

According to another advantageous refinement of the present invention, the respective thickness of at least two electrodes in parallel to the deflection direction of the first functional layer is identical. In this way, a particularly simple manufacture is made possible since different layer thicknesses do not have to be taken into consideration.

According to another advantageous refinement of the present invention, the substrate is doped in the area beneath the second area of the first electrode or includes a metal layer. This counteracts the development of parasitic capacitances between the second area of the first electrode and the substrate, which would reduce the sensitivity of the sensor. In this regard, the robustness of the sensor is increased.

According to another advantageous refinement of the present invention, the first and second areas of the first electrode are manufactured from material of different layers, in particular, the material of different layers being identical. In this way, a simple manufacture with the aid of a layer construction is possible since the first and second areas then correspond to different layers. At the same time, in particular, it is not necessary to use different materials, which counteracts stresses between different materials.

According to another advantageous refinement of the present invention, the first electrode, in particular the second area, includes a reinforcement structure. This reduces or prevents a bending of the electrode due to intrinsic stresses. In other words, an increase in stiffness is achieved as a result of the local stiffening, with which additionally the natural frequency of the electrodes may be set so that resonances may be avoided during the manufacture or during use.

According to another advantageous refinement of the present invention, the reinforcement structure is formed by a partial connection of the layer of the second area of the first electrode to the layer in which the third electrode is situated. In this way, a simple, and simultaneously reliable, reinforcement structure is achieved, without minimizing a relative movement of the electrodes with respect to one another.

According to another advantageous refinement of the present invention, the deflectably situated functional layer includes two mechanically separated, deflectable areas, the first area of the first electrode and of the second electrode being situated in the first deflectable area, and the second area of the first electrode and of the third electrode being situated in the second deflectable area. In this way, essentially two separate deflectable functional layers, for example two separate diaphragms, are provided, which each only include one electrode type. In this way, not only an electrical, but also a mechanical separation is achieved. As a result of the mechanical separation or decoupling, it is possible, in particular, to implement a full bridge in the form of a Wheatstone bridge circuit, and the sensitivity with respect to externally applied intrinsic mechanical stresses is reduced.

Further important features and advantages of the present invention disclosed herein.

It shall be understood that the above-mentioned features and those still to be described hereafter may be used not only in the particular described combination, but also in other combinations, or alone, without departing from the scope of the present invention.

Preferred embodiments and specific embodiments of the present invention are shown in the figures and are described in greater detail in the following description, identical reference numerals referring to identical or similar or functionally equivalent components or elements.

DETAILED DESCRIPTION OF EXAMPLE EMBODIMENTS

Figure 1:
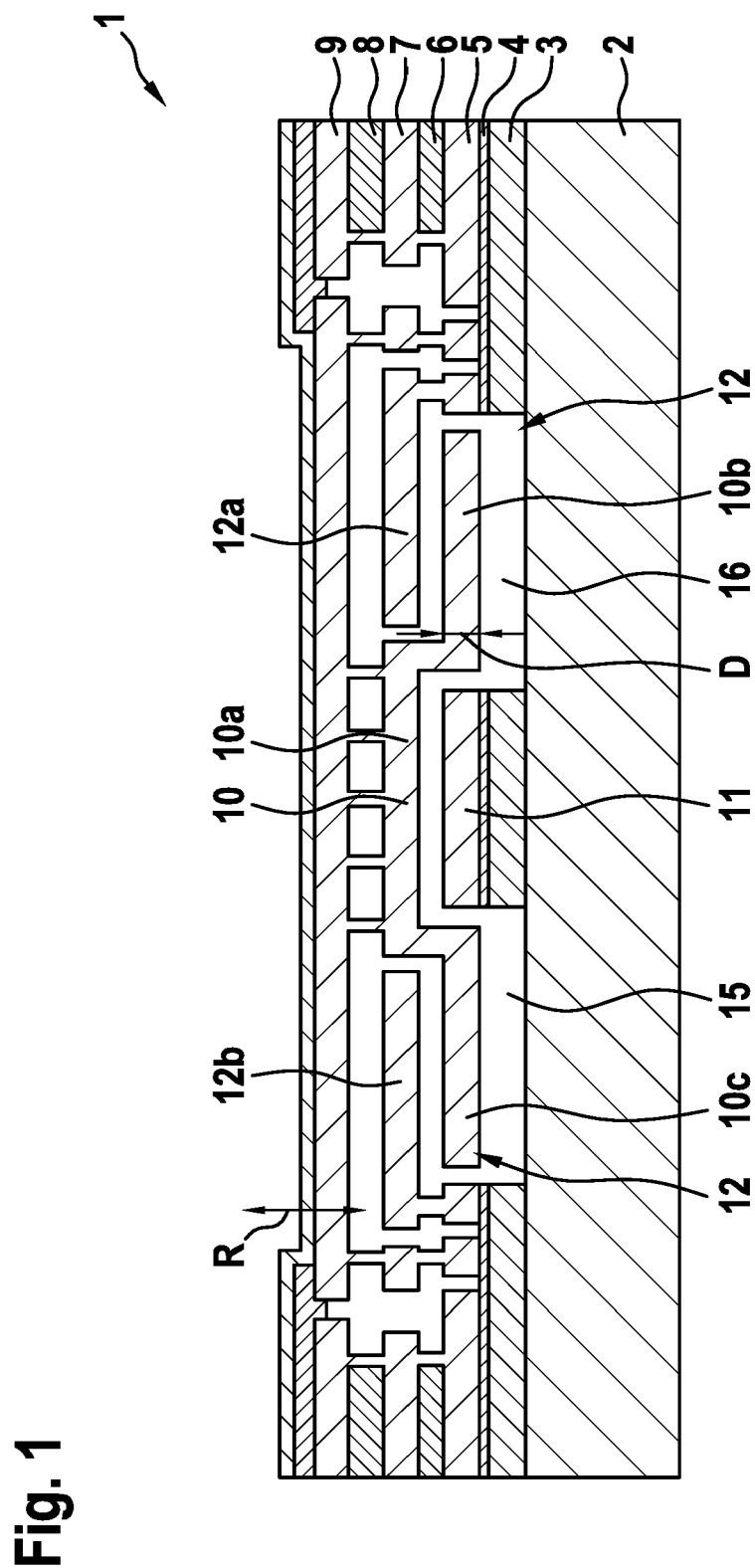
FIG. 1 shows a MEMS sensor in the cross section according to one specific embodiment of the present invention.

FIG. 1 shows a MEMS sensor in the cross section according to one specific embodiment of the present invention.

In detail, the layer construction of MEMS sensor 1 according to FIG. 1 is as follows. A LOCOS oxide layer 3 is applied onto a substrate 2, on which, in turn, a silicon-rich nitride layer 4 is situated. This takes place with the aid of a so-called LOCOS process in which a thick oxide layer 3 is generated, on which a thin silicon-rich layer 4 is deposited. Furthermore, functional layers 5, 7, 9 and interposed oxide layers 6, 8 are alternately deposited and later partially removed again to form cavities and hollow spaces. A deflectable functional layer 9 is situated, more precisely, deposited, on the upper side of oxide layer 8 after corresponding cavities for the electrodes described hereafter have been generated. Functional layer 9 is deflectable perpendicular to layers 2, 3, 4, 5, 6, 7, 8, 9 in direction R.

In FIG. 1, the thickness of functional layer 5, in contrast to known MEMS sensors, is identical to, or at least similar to, that of functional layers 7 and 9 situated above, and may thus be utilized as a complete third functional layer. As is described hereafter, stable movable electrodes are implemented in this third functional layer 5. Thereafter, all oxide layers in the deflection area of functional layer 9 below it are removed. In the process, silicon-rich layer 4 may be utilized as a masking layer to introduce cavities into LOCOS layer 3 situated beneath. These cavities 15, 16 enable an out-of-plane movement of the following described electrodes in functional layer 5. An electrode 10 is situated on the bottom side of the deflectable functional layer 9. It has a symmetrical design in the cross section; in the center, first electrode 10 (at the height of functional layer 7) includes a horizontal area 10a, which cooperates with a second electrode 11 in the area of functional layer 5 for forming a first capacitance C1. The two electrodes 10a, 11 are situated spaced apart from one another in the process. The distance in the non-deflected state essentially results from the thickness of oxide layer 6. A further area 10b, 10c, which is situated at the height of functional layer 5, is now situated in each case laterally on the left and right. Sub-electrodes of a third electrode 12 are situated spaced apart therefrom and above the respective area 10b, 10c, more precisely areas 12a, 12b are situated at the height of functional layer 7. The distance between areas 10c, 12b or 10b, 12a again essentially corresponds to the thickness of oxide layer 6. Thickness D of areas 10b, 10c as well as of electrode 11 corresponds to the thickness of functional layer 5. In the process, the two areas 12a, 12b form third electrode 12, which is statically situated. First electrode 10 and third electrode 12 form a second capacitance C2 in the process.

In this way, essentially the following behavior is achieved: a differential capacitor is provided, in which all plates and plate distances of electrodes 10, 11, 12 are constructed of the same layers. In this way, the influence of production tolerances may be reduced. Two options may be implemented using the differential capacitor. The first is that a full bridge may be formed from a half bridge, which has double the sensitivity and considerably better linearity compared to the half bridge. The advantage of a full bridge, in turn, is that the number of contactings or bond pads between the ASIC and the MEMS chip for contacting the full bridge is not greater than in the case of a half bridge. In the process, only two contactings are required for the bridge input voltage, and two further contactings are required for the bridge output voltage, since the wiring of the described capacitances takes place between electrodes 10a, 11 and 10b, 10c, 12a, 12b on the chip.

The second option is to measure capacitances C1 and C2 separately using the ASIC, bond pads being required for measuring n capacitances (n+1). This method has the advantage that with the aid of the equation $$\text{Signal} = \frac{C2 - C1}{C2 + C1}$$

a complete linearization is achieved, capacitance C2 encompassing all closing capacitances, and C1 encompassing all opening capacitances.

Figure 2:
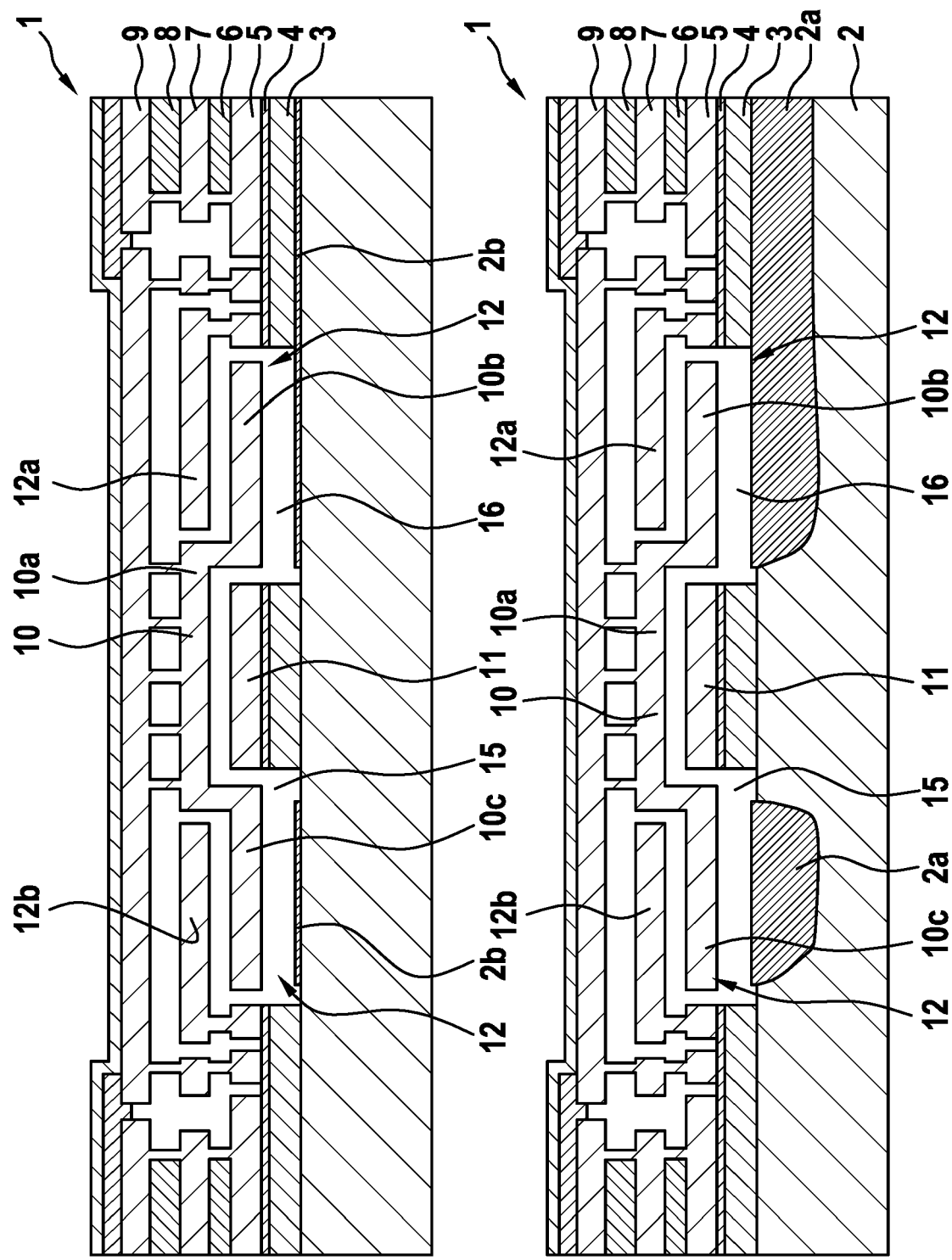
FIG. 2 shows two MEMS sensors in the cross section according to specific embodiments of the present invention.

FIG. 2 shows two MEMS sensors in the cross section according to specific embodiments of the present invention.

FIG. 2 essentially shows a respective MEMS sensor 1 according to FIG. 1 at the bottom and at the top. In contrast to MEMS sensor 1 according to FIG. 1, in the case of MEMS sensor 1 according to the top of FIG. 2, a thin metallization layer 2b is situated on substrate 2 in the area beneath areas 10b, 10c of first electrode 10, in particular having a thickness between 200 nm and 600 nm, in particular, between 300 nm and 500 nm. At the bottom of FIG. 2, substrate 2 is doped (reference numeral 2a) instead of metallization level 2b. With the aid of metallization level 2b or doping 2a, this area of substrate 2 is rendered locally conductive and parasitic capacitances are counteracted, which arise, for example, between substrate 2 and the respective area 10b, 10c and disrupt the sensitivity of MEMS sensor 1.

Figure 3:
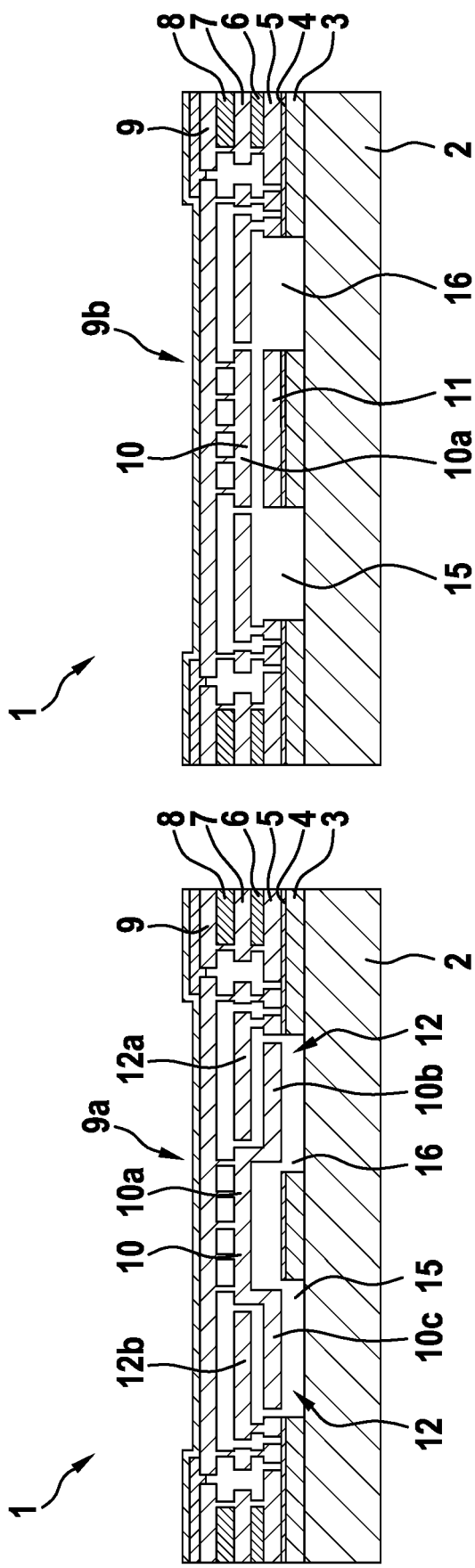
FIG. 3 shows two mechanically separated areas of a MEMS sensor in the cross section according to one specific embodiment of the present invention.

FIG. 3 shows two mechanically separated areas of a MEMS sensor in the cross section according to one specific embodiment of the present invention. FIG. 3 on the left and right essentially shows a design of a MEMS sensor 1 according to FIG. 1 in detail. In contrast to MEMS sensor 1 according to FIG. 1, the second central electrode 11 is missing in the shown portion of MEMS sensor 1 according to the left side of FIG. 3, and the two areas 10b, 10c of first electrode 10 are missing in the portion of MEMS sensor 1 according to the right side of FIG. 3. The portions shown on the left and right of FIG. 3 form a MEMS sensor 1. In the process, the two portions of MEMS sensor 1 each form a portion 9a, 9b of a deflectable functional layer 9, which are mechanically and electrically separated from one another. As a result of the mechanical decoupling, it is possible to implement a full bridge, and the sensitivity with respect to externally mustered intrinsic mechanical stresses is reduced.

Figure 4:
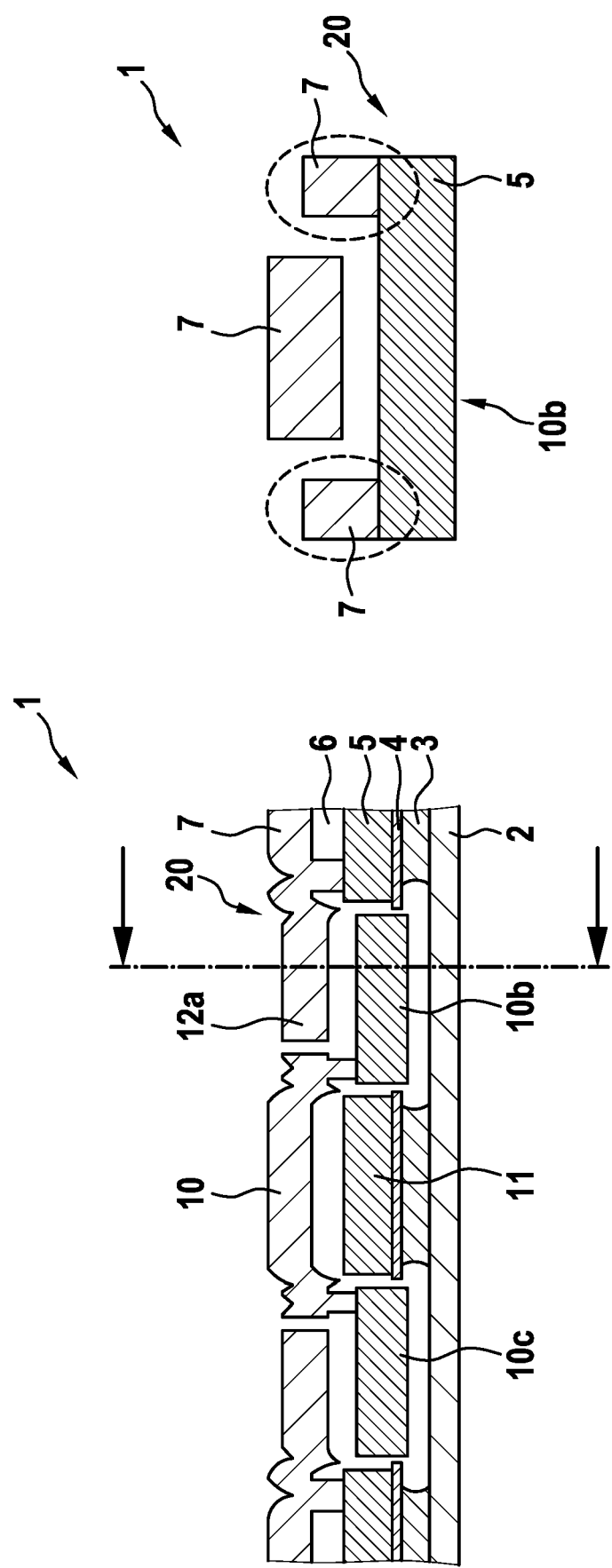
FIG. 4 shows a section of a MEMS sensor in the cross section along different directions according to one specific embodiment of the present invention.

FIG. 4 shows a section of a MEMS sensor in the cross-section along different directions according to one specific embodiment of the present invention.

FIG. 4 shows a section of a MEMS sensor 1 according to FIG. 1 in the cross section along different directions. In contrast to MEMS sensor 1 according to FIG. 1, a reinforcement structure 20 is situated on MEMS sensor 1 according to FIG. 4. This reinforcement structure 20 locally reinforces area 10b of movable electrode 10 in that layer 7 of the static electrode is connected together with layer 5 of movable electrode 10, so that essentially a kind of T-beam is provided. In this way, the stiffness is increased, and based on the increase of the stiffness, the natural frequency of areas 12a, 10b of the respective electrode 10, 12, in particular of the movable electrode areas 10b, 10c, which are situated in layer 5, may be set, so that resonances are avoided during the manufacture or during use.

Figure 5:
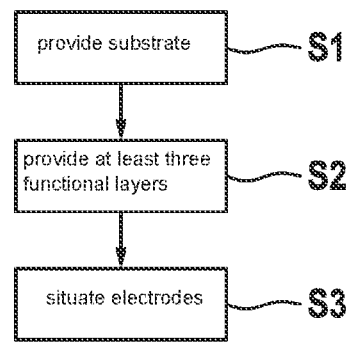
FIG. 5 shows steps of a method according to one specific embodiment of the present invention.

FIG. 5 shows steps of a method according to one specific embodiment of the present invention.

FIG. 5 shows steps of a method for manufacturing a MEMS sensor in detail. It includes the steps:

In a step S1, a substrate; is provided.

In a further step S2, at least three functional layers are provided, which are connected to the substrate on top of one another and spaced apart from one another.

In a further step S3, a first electrode, which includes at least two areas, is situated at the first functional layer, a first area of the first electrode together with a second electrode of a second of the at least three functional layers forming a first capacitance, and a second area of the first electrode together with at least one area of a third electrode of a third functional layer forming a second capacitance, and the electrodes being situated in such a way that upon a change in the distance of the electrodes of the first capacitance a contrary change in the distance of the electrodes of the second capacitance takes place.

In summary, at least one of the specific embodiments of the present invention yields at least one of the following advantages:

increase in the sensitivity by a factor of 2 with the same area:
  better resolution and signal-to-noise ratio.
fully diff concept:
  electrical sensitivity linear across the entire measurement range.
  mechanical decoupling over two separate diaphragms possible, which each only include one of the two electrode types, opening on the one hand and closing on the other hand.
lower costs:
  with the same sensitivity, reduction of the chip area by a factor of 2 compared to known MEMS sensors.
  static, non-sensitive reference electrodes are dispensed with.
  evaluation in full bridge circuit using a low number of contact pads possible, in particular with the aid of four pads.
lower influence of process fluctuations:
  all electrodes and electrode distances are created by the same layers, for example all electrode distances are implemented by the same oxide.
stiffening of movable electrodes through "T-beams":
  setting of the natural frequency to avoid resonances during manufacture/use.
  reduction of the bending of electrodes.

Although the present invention has been described based on preferred exemplary embodiments, it is not limited thereto, but is modifiable in a variety of ways.

What is claimed is:

1. A MEMS sensor, comprising:
    a substrate;
    at least three functional layers which are connected to the substrate on top of one another and spaced apart from one another, a first functional layer of the at least three functional layers being deflectably situated, a first electrode which includes at least two areas being situated at the first functional layer, a first area of the at least two areas of the first electrode together with a second electrode of a second functional layer of the at least three functional layers forming a first capacitance, and a second area of the at least two areas of the first electrode together with at least one area of a third electrode of a third functional layer of the at least three functional layers forming a second capacitance, and wherein the first, second, and third electrodes a situated in such a way that upon a change in a distance of the first and electrodes of the first capacitance a contrary change in a distance of the first and third electrodes of the second capacitance takes place.

2. The MEMS sensor as recited in claim 1, wherein the second and third electrodes are statically situated.

3. The MEMS sensor as recited in claim 1, wherein the second electrode is situated beneath, and at least one area of the third electrode is situated above, the respective area of the first electrode.

4. The MEMS sensor as recited in claim 1, wherein the first electrode is symmetrically designed in a cross section in parallel to a deflection direction of the first functional layer.

5. The MEMS sensor as recited in claim 4, wherein the third electrode includes at least two sub-electrodes situated symmetrically to the first area of the first electrode, and the second area of the first electrode includes two sub-areas, a respective sub-area being designed to cooperate with a sub-electrode for forming the second capacitance.

6. The MEMS sensor as recited in claim 1, wherein a respective thickness of at least two of the first, second, and third electrodes in parallel to a deflection direction of the first functional layer is identical.

7. The MEMS sensor as recited in claim 1, wherein the substrate is doped in an area beneath the second area of the first electrode or includes a metal layer.

8. The MEMS sensor as recited in claim 1, wherein the first and second areas of the first electrode are manufactured from material of different layers, the material of different layers being identical.

9. The MEMS sensor as recited in claim 1, wherein the first electrode in the second area includes a reinforcement structure.

10. The MEMS sensor as recited in claim 9, wherein the reinforcement structure is formed by a partial connection of a layer of the second area of the first electrode to a layer in which the third electrode is situated.

11. A MEMS sensor, comprising:
a substrate;
at least three functional layers which are connected to the substrate on top of one another and spaced apart from one another, a first functional layer of the at least three functional layers being deflectably situated, a first electrode which includes at least two areas being situated at the first functional layer, a first area of the at least two areas of the first electrode together with a second electrode of a second functional layer of the at least three functional layers forming a first capacitance, and a second area of the at least two areas of the first electrode together with at least one area of a third electrode of a third functional layer of the at least three functional layers forming a second capacitance, and wherein the first, second, and third electrodes a situated in such a way that upon a change in a distance of the first and electrodes of the first capacitance a contrary change in a distance of the first and third electrodes of the second capacitance takes place,
wherein the deflectably situated functional layer includes two mechanically separated, deflectable areas, the first area of the first electrode and a first area of the second electrode being situated in a first deflectable area of the deflectable areas, and the second area of the first electrode and a second area of the third electrode being situated in a second deflectable area of the deflectable area.

12. A method for manufacturing a MEMS sensor, comprising the following steps:
providing a substrate;
providing at least three functional layers, which are connected to the substrate on top of one another and spaced apart from one another;
situating a first electrode, which includes at least two areas, at the first functional layer, a first area of the at least two areas of the first electrode together with a second electrode of a second functional layer of the at least three functional layers forming a first capacitance, and a second area of the at least two areas of the first electrode together with at least one area of a third electrode of a third functional layer of the at least three functions layers forming a second capacitance; and
wherein the first, second, and third electrodes are situated in such a way that upon a change in a distance of the first and electrodes of the first capacitance a contrary change in a distance of the first and third electrodes of the second capacitance takes place.

* * * * *